(12) United States Patent
Wang et al.

(10) Patent No.: US 12,363,843 B2
(45) Date of Patent: Jul. 15, 2025

(54) ROTATION CONNECTION STRUCTURE AND ELECTRONIC APPARATUS

(71) Applicant: Lenovo (Beijing) Limited, Beijing (CN)

(72) Inventors: Lei Wang, Beijing (CN); Xingzhou Yu, Beijing (CN); Zhenling Zhang, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 203 days.

(21) Appl. No.: 18/122,541

(22) Filed: Mar. 16, 2023

(65) Prior Publication Data
US 2023/0320007 A1 Oct. 5, 2023

(30) Foreign Application Priority Data
Mar. 31, 2022 (CN) .......................... 202210332717.0

(51) Int. Cl.
*H05K 5/00* (2025.01)
*F16C 11/04* (2006.01)
*H05K 5/02* (2006.01)

(52) U.S. Cl.
CPC ............ *H05K 5/0226* (2013.01); *F16C 11/04* (2013.01)

(58) Field of Classification Search
None
See application file for complete search history.

(56) References Cited

U.S. PATENT DOCUMENTS

| 10,761,573 | B2 * | 9/2020 | Hsu ...................... G06F 1/1681 |
| 11,553,613 | B2 * | 1/2023 | Sim ...................... G06F 1/1681 |
| 11,599,155 | B2 * | 3/2023 | Siddiqui ............... G06F 1/1679 |
| 2021/0307186 | A1 * | 9/2021 | Hong .................. H04M 1/0216 |

FOREIGN PATENT DOCUMENTS

CN             111107189 A      5/2020

* cited by examiner

*Primary Examiner* — Anthony Q Edwards
*Assistant Examiner* — Rashen E Morrison
(74) *Attorney, Agent, or Firm* — ANOVA LAW GROUP, PLLC

(57) ABSTRACT

A rotation connection mechanism includes a plate assembly, a movement structure assembly, and a torsion structure assembly. The plate assembly includes a middle plate, a first plate, and a second plate. The first plate is rotatably connected to the middle plate. The second plate is rotatably connected to the middle plate. The movement structure assembly includes a first movement structure and a second movement structure. The first movement structure is arranged at a first end of the plate assembly. The second movement structure is arranged symmetrically with the first movement structure and arranged at a second end of the plate assembly. The torsion structure assembly is arranged on a side of the middle plate and includes a first torsion structure and a second torsion structure. The first torsion structure cooperates with the first movement structure. The second torsion structure cooperates with the second movement structure.

18 Claims, 13 Drawing Sheets

ROTATION CONNECTION STRUCTURE AND ELECTRONIC APPARATUS

CROSS-REFERENCE TO RELATED APPLICATION

This application claims priority to Chinese Patent Application No. 202210332717.0, filed on Mar. 31, 2022, the entire content of which is incorporated herein by reference.

TECHNICAL FIELD

The present disclosure relates to the electronic apparatus technology field and, more particularly, to a rotation connection structure and an electronic apparatus.

BACKGROUND

With the development of technology, a folding electronic apparatus, such as a cellphone with a folding screen and a computer with a folding screen, is developed. The folding electronic apparatus is switched between an unfolded posture and a folded posture by bending the folding screen.

The folding electronic apparatus is connected to a support shell fixed to a non-bending area at two ends of the folding screen through a rotation shaft device. The folding screen is driven by the opening and closing of the support shell to bend. However, the existing rotation shaft device is arranged on a back side of the folding screen opposite to a display surface. The rotation shaft device needs to individually occupy an overall thickness space of the electronic apparatus. To reduce the thickness of the electronic apparatus, the folding screen needs to adopt a smaller screen bending angle to reduce the overall thickness space required by the folding screen, which makes it difficult to bend and causes more creases on the folding screen. Thus, the performance of the folding screen is impacted.

SUMMARY

Embodiments of the present disclosure provide a rotation connection mechanism, including a plate assembly, a movement structure assembly, and a torsion structure assembly. The plate assembly includes a middle plate, a first plate, and a second plate. The first plate is rotatably connected to the middle plate. The second plate is rotatably connected to the middle plate. The movement structure assembly includes a first movement structure and a second movement structure. The first movement structure is arranged at a first end of the plate assembly. The second movement structure is arranged symmetrically with the first movement structure and arranged at a second end of the plate assembly. The torsion structure assembly is arranged on a side of the middle plate and includes a first torsion structure and a second torsion structure. The first torsion structure cooperates with the first movement structure. The second torsion structure cooperates with the second movement structure. The movement structure assembly is configured to control the first plate and the second plate to be at a first relative position. The first plate, the middle plate, and the second plate form a plane. The movement structure assembly is configured to control the first plate and the second plate to be at a second relative position. The first plate and the second plate face to each other and have a target angle. The torsion structure assembly provides torsion support at the first relative position and the second relative position through the movement structure assembly. The torsion structure assembly provides a force for switching of the first plate and the second plate between the first relative position and the second relative position through the movement structure.

Embodiments of the present disclosure provide an electronic apparatus, including a first body, a second body, a rotation connection mechanism, and a flexible display touchscreen. The first body is movably connected to the second body through the rotation connection mechanism. The rotation connection mechanism includes a plate assembly, a movement structure assembly, and a torsion structure assembly. The plate assembly includes a middle plate, a first plate, and a second plate. The first plate is rotatably connected to the middle plate. The second plate is rotatably connected to the middle plate. The movement structure assembly includes a first movement structure and a second movement structure. The first movement structure is arranged at a first end of the plate assembly. The second movement structure is arranged symmetrically with the first movement structure and arranged at a second end of the plate assembly. The torsion structure assembly is arranged on a side of the middle plate and includes a first torsion structure and a second torsion structure. The first torsion structure cooperates with the first movement structure. The second torsion structure cooperates with the second movement structure. A first part of the flexible display touchscreen is fixed on a first surface of the first body. A second part of the flexible display touchscreen is fixed on a second surface of the second body. A third part of the flexible display touchscreen is arranged between the first part and the second part. The third part of the flexible display touchscreen is a flexible bending part. A movement structure assembly of the rotation connection mechanism is located outside a coverage area of the flexible display touchscreen. The first body is in a first posture with the second body through the rotation connection mechanism. The first plate of the rotation connection mechanism and the second plate of the rotation connection mechanism are at a first relative position. The first plate, the second plate, and the middle plate form a plane. The plane is coplanar with the first surface of the first body and the second surface of the second body. The first body is in a second posture with the second body through the rotation connection mechanism. The first plate of the rotation connection mechanism and the second plate of the rotation connection mechanism are at a second relative position. The first plate and the second plate face each other and have a target angle. The torsion structure assembly provides torsion support at a first relative position and the second relative position through the movement structure assembly. The torsion structure assembly provides a force for switching the first plate and the second plate between the first relative position and the second relative position through the movement structure.

DETAILED DESCRIPTION OF THE EMBODIMENTS

Figure 1:
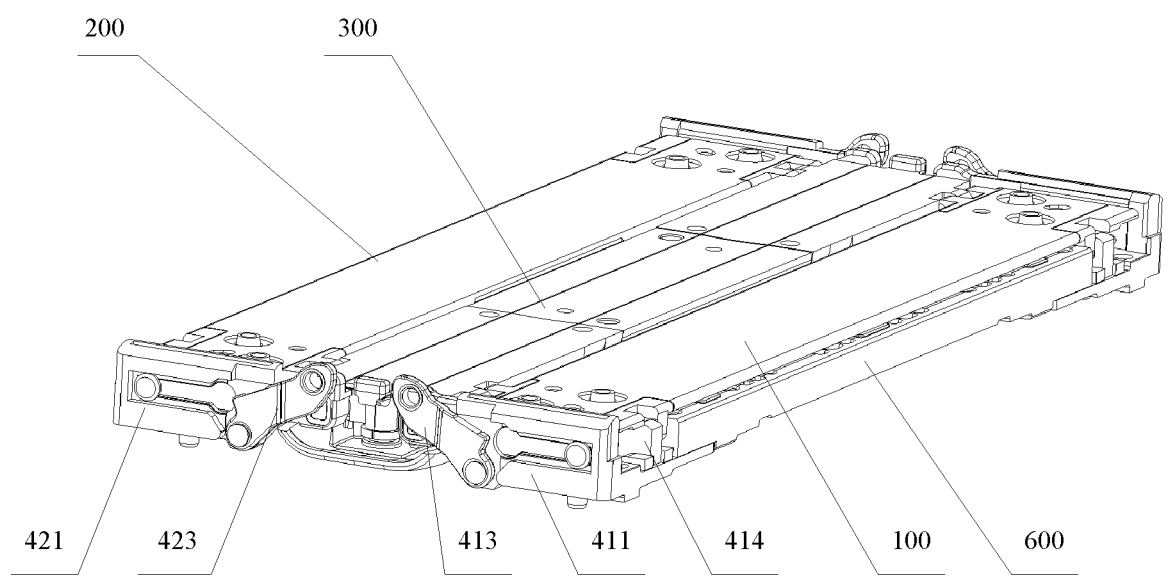
FIG. 1 illustrates a schematic structural diagram of a rotation connection structure at a first posture according to some embodiments of the present disclosure.
Figure 2:
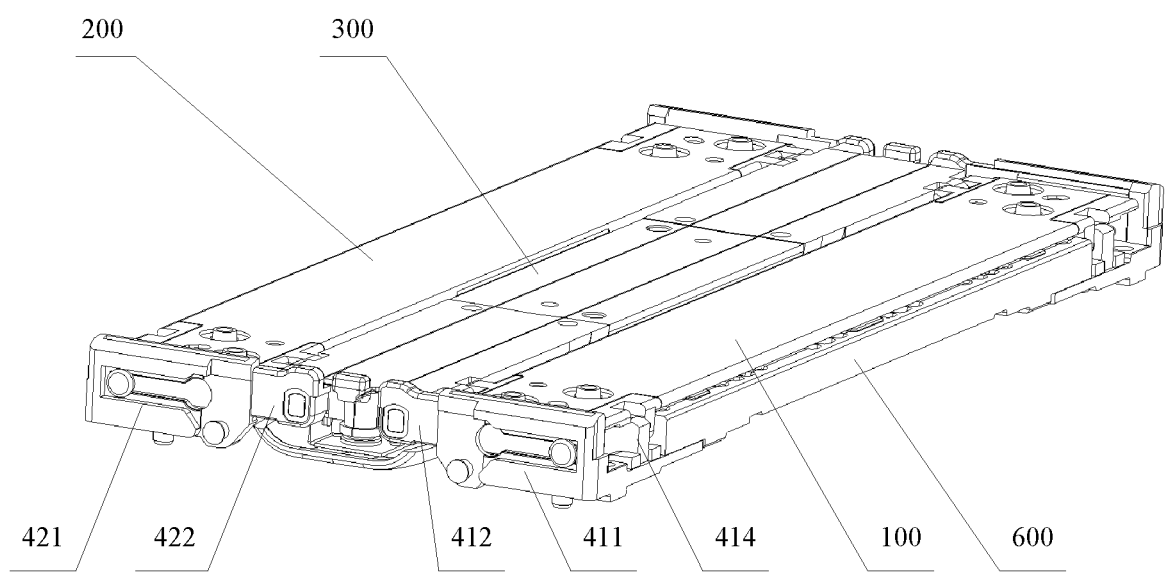
FIG. 2 illustrates a schematic structural diagram showing a rotation connection structure without a first connection shaft and a second connection shaft at a first posture according to some embodiments of the present disclosure.

The present disclosure discloses a rotation connection structure to improve the usability of a folding screen. The present disclosure also provides an electronic apparatus having the above rotation connection structure.

The technical solutions of embodiments of the present disclosure are described in detail below in connection with the accompanying drawings of embodiments of the present disclosure. Obviously, described embodiments are only some embodiments of the present disclosure, not all embodiments. Based on embodiments of the present disclosure, all other embodiments obtained by those of ordinary skill in the art without creative efforts should be within the scope of the present disclosure.

In the rotation connection structure and the rotation connection mechanism of embodiments of the present disclosure, by controlling the first plate and the second plate to switch between the first relative position and the second relative position through the movement structure assembly, the torsion structure assembly can be configured to provide the torsion support at the first relative position and the second relative position through the movement structure assembly. Moreover, under the external force, the torsion structure assembly can provide the force for switching the first plate and the second plate between the first relative position and the second relative position through the movement structure assembly. Through the above arrangement, the switching operation of the first plate and the second plate between the first relative position and the second relative position can be realized, and the states of the first plate and the second plate can be supported at the first relative position and the second relative position.

When the first plate and the second plate are at the first relative position, the first plate, the middle plate, and the second plate can form a plane. That is, the inner side of the first plate, the middle plate, and the second plate (the side facing the screen) can be located on the same plane. By providing the torsion support by the torsion structure assembly at the first relative position, the stability of the first plate and the second plate at the first relative position can be ensured. Thus, the first plate, the middle plate, and the second plate can be configured to provide effective support for the flexible bending part of the folding screen (such as the flexible display touchscreen) to ensure the support effect and facilitate the operator to operate. When the first plate and the second plate are switched from the first relative position to the second relative position, the external force can be provided by the operator or the apparatus. Under the external force, the torsion structure assembly can provide the force for switching the first plate and the second plate between the first relative position and the second relative position through the movement structure assembly. Thus, the movement structure assembly can control the first plate and the second plate to switch between the first relative position and the second relative position. When the first plate and the second plate are at the second relative position, the first plate and the second plate can have a target angle. Thus, the first plate and the second plate can rotate relative to the middle plate. Thus, the first plate and the second plate can guide the bending of the flexible bending part of the folding screen (the flexible display touchscreen) arranged between the first plate and the second plate. By providing the torsion support at the second relative position through the torsion structure assembly, the stability of the first plate and the second plate at the second relative position can be ensured. Thus, the folding screen (i.e., the flexible display touchscreen) can have the predetermined target bending angle. When the first plate and the second plate are switched from the second relative position to the first relative position, the operator or the apparatus can provide the external force. Under the external force, the torsion structure assembly can provide the force for switching the first plate and the second plate between the first relative position and the second relative position through the movement structure assembly. Thus, the movement structure assembly can control the first plate and the second plate to switch between the first relative position and the second relative position. Through the cooperation between the torsion structure assembly and the movement structure assembly, the bending operation can be facilitated. At the first relative position, the first plate, the middle plate, and the second plate can form the plane to support the folding screen (i.e., the flexible display touchscreen). At the second relative position, the first plate and the second plate can have the target angle, which facilitates the bending of the folding screen (i.e., the flexible display touchscreen), and reduces the probability of the ceases occurring on the folding screen to ensure the performance of the folding screen.

Since the movement structure assembly includes the first movement structure and the second movement structure symmetrical arranged to the first movement structure. The first movement structure can be arranged at the first end of the plate assembly, and the second movement structure can be arranged at the second end of the plate assembly. The first end of the plate assembly can be the same side end of the first plate, the second plate, and the middle plate, and the second end of the plate assembly can be the other same side end of the first plate, the second plate, and the middle plate. Through the above arrangement, the movement structure assembly can be located on the side of the plate assembly. At the first relative position and the second relative position, the movement structure assembly can be located at the end of the plate assembly and cannot affect the switching of the plate assembly between the first relative position and the second relative position. The movement structure assembly does not occupy a dimension of the plate assembly in the thickness direction. The required overall thickness of the rotation connection mechanism can be reduced at the first relative position and the second relative position. The bending angle of the folding screen can be ensured, and the probability of the ceases occurring on the folding screen can be reduced to further ensure the performance of the folding screen.

As shown in FIG. 1 to FIG. 16, embodiments of the present disclosure provide a rotation connection mechanism. The rotation connection mechanism includes a plate assembly, a movement structure assembly, and a torsion structure assembly. The plate assembly includes a first plate 100, a second plate 200, and a middle plate 300. The first plate 100 can be rotatably connected to the middle plate 300. The second plate 200 can be rotatably connected to the middle plate 300. The movement structure assembly can include a first movement structure and a second movement structure arranged symmetrically to the first movement structure. The first movement structure can be located at a first end of the plate assembly, and the second movement structure can be located at a second end of the plate assembly. The movement structure assembly can be configured to control the first plate 100 and the second plate 200 to be at a first relative position and control the first plate 100, the middle plate 300, and the second plate 200 to form a plane. The movement structure assembly can be configured to control the first plate 100 and the second plate 200 to be at a second relative position and control the first plate 100 and the second plate 200 to be opposite to each other and have a target angle. The torsion structure assembly can be located on a side of the middle plate. The torsion structure assembly can include a first torsion structure and a second torsion structure. The first torsion structure can cooperate with the first movement structure, and the second torsion structure can cooperate with the second movement structure. The torsion structure assembly can provide torsion support at the first relative position and the second relative position through the movement structure assembly. The torsion structure assembly can provide a force to the first plate and the second plate to be switched between the first relative position and the second relative position through the movement structure assembly under an external force.

The rotation connection mechanism of embodiments of the present disclosure can be configured to control the first plate 100 and the second plate 200 to be switched between the first relative position and the second relative position through the movement structure assembly. The torsion structure assembly can be configured to provide torsional support at the first relative position and the second relative position through the movement structure assembly. Moreover, under the external force, the torsion structure assembly can be configured to provide the force to the first plate 100 and the second plate 200 to be switched between the first relative position and the second relative position through the movement structure assembly. Through the above arrangement, the first plate 100 and the second plate 200 can be switched between the first relative position and the second relative position, and states of the first plate 100 and the second plate 200 can be supported in the first relative position and the second relative position.

In some embodiments, the first plate 100 and the second plate 200 can be at the first relative position, and the first plate 100, the middle plate 300, and the second plate 200 can form a plane. That is, an inner side of the first plate 100, an inner side of the middle plate 300, and an inner side of the second plate 200 (sides facing a screen) can be located on the same plane. The torsion structure assembly can provide the torsion support at the first relative position to ensure the stability of the first plate 100 and the second plate 200 at the first relative position. Thus, the first plate 100, the middle plate 300, and the second plate 200 can be configured to provide effective support for a flexible bending part of the folding screen (such as a flexible display touchscreen) to ensure a supporting effect and facilitate an operation of an operator. When the first plate 100 and the second plate 200 are switched from the first relative position to the second relative position, an external force can be provided by the operator or the apparatus. Under the external force, the torsion structure assembly can provide the force for the first plate 100 and the second plate 200 to be switched between the first relative position and the second relative position through the movement structure assembly. Thus, the movement structure assembly can control the first plate 100 and the second plate 200 to be switched between the first relative position and the second relative position. In some other embodiments, the first plate 100 and the second plate 200 can be in the second relative position, and the first plate 100 and the second plate 200 can be opposite to each other and have the target angle. Thus, the first plate 100 and the second plate 200 can rotate relative to the middle plate 300. The first plate 100 and the second plate 200 can guide the bending of the flexible bending part of the folding screen (i.e., a flexible display touchscreen) located between the first plate 100 and the second plate 200. The torsion structure assembly can provide the torsion support at the second relative position to ensure the stability of the first plate 100 and the second plate 200 at the second relative position to ensure that the folding screen (i.e., a flexible display touchscreen) achieves a predetermined target screen bending angle. When the first plate 100 and the second plate 200 are switched from the second relative position to the first relative position, the operator or apparatus can provide an external force. Under the external force, the torsion structure assembly can provide the force to the first plate 100 and the second plate 200 to be switched between the first relative position and the second relative position through the movement structure assembly. A bending operation can be facilitated through a combined action of the movement structure assembly and the torsion structure assembly. At the first relative position, the first plate 100, the middle plate 300, and the second plate 200 can form a plane. Thus, the plane can support the folding screen (i.e., a flexible display touchscreen). At the second relative position, the first plate 100 and the second plate 200 can be opposite to each other and have the target angle, which facilitates the bending of the folding screen (i.e., a flexible display touchscreen), reduces the probability of creases occurring on the folding screen, and ensures the performance of the folding screen.

Since the movement structure assembly includes the first movement structure and the second movement structure arranged symmetrically to the first movement structure, the first movement structure can be located at the first end of the plate assembly, and the second movement structure can be located at the second end of the plate assembly. The first end of the plate assembly can be an end on a same side of the first plate 100, the second plate 200, and the middle plate 300. The second end of the plate assembly can be an end on another same side of the first plate 100, the second plate 200, and the middle plate 300. Through the above arrangement, the movement structure assembly can be located outside the plate assembly. At the first relative position and the second relative position, the movement structure assembly can be located at the end of the plate assembly and cannot affect the switching of the plate assembly between the first relative position and the second relative position. The movement structure assembly may not occupy the space of the plate assembly in a thickness direction. Thus, the overall thickness of the rotation connection mechanism can be reduced at the first relative position and the second relative position, the bending angle of the folding screen can be ensured, the probability of the creases occurring on the folding screen can be lowered, and the application performance of the folding screen can be further ensured.

Moreover, space on the back of the rotation connection mechanism (a side of the middle plate 300 facing away from the folding screen) can be avoided. In addition to arranging the torsion structure assembly, other members can also be arranged, e.g., a connection member such as a flexible printed circuit board connecting a first body and a second body of the electronic apparatus connecting the first body and the second body of the electronic apparatus. The other members can also be arranged in space between the side of the middle plate 300 away from the folding screen and the outer shell, which is convenient for layout and arrangement.

Figure 9:
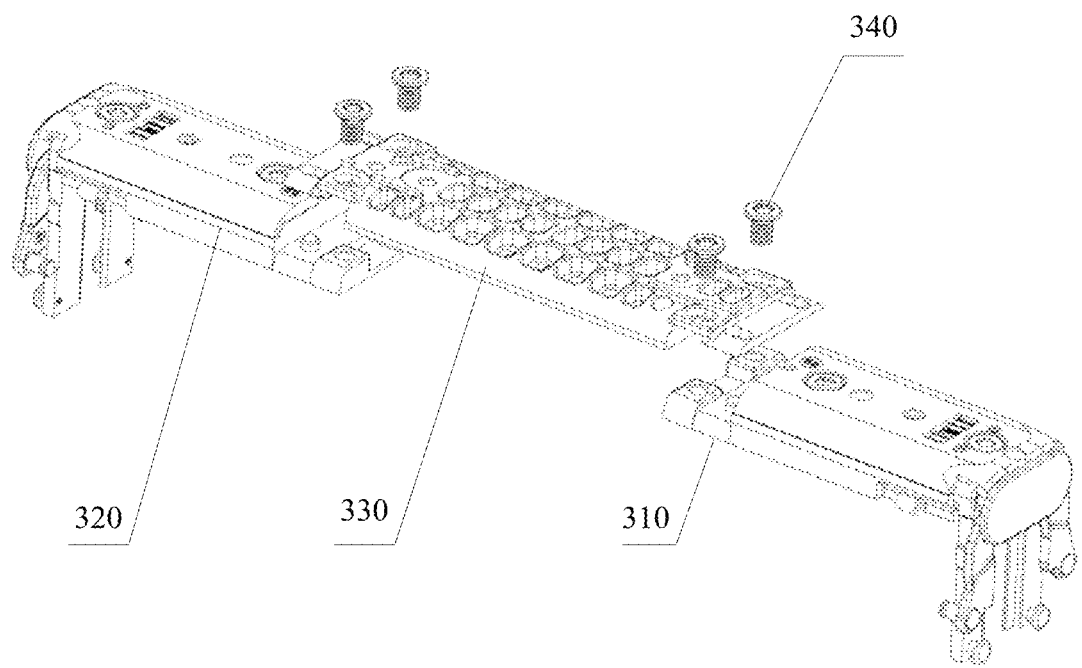
FIG. 9 illustrates a schematic exploded structural diagram of a middle plate according to some embodiments of the present disclosure.
Figure 10:
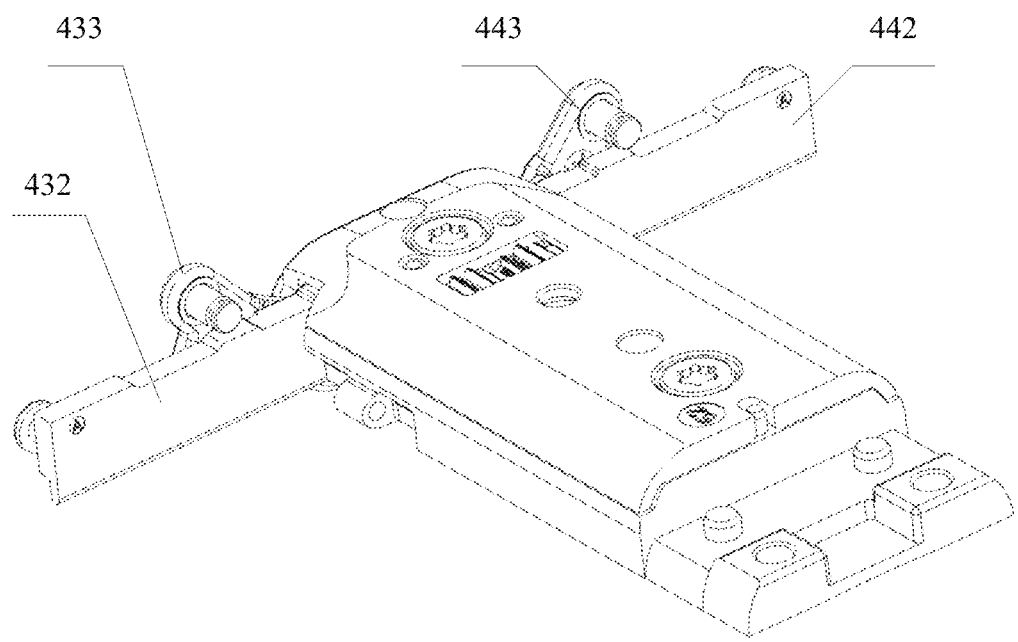
FIG. 10 illustrates a schematic structural diagram showing a second center plate segment and a second movement structure according to some embodiments of the present disclosure.
Figure 11:
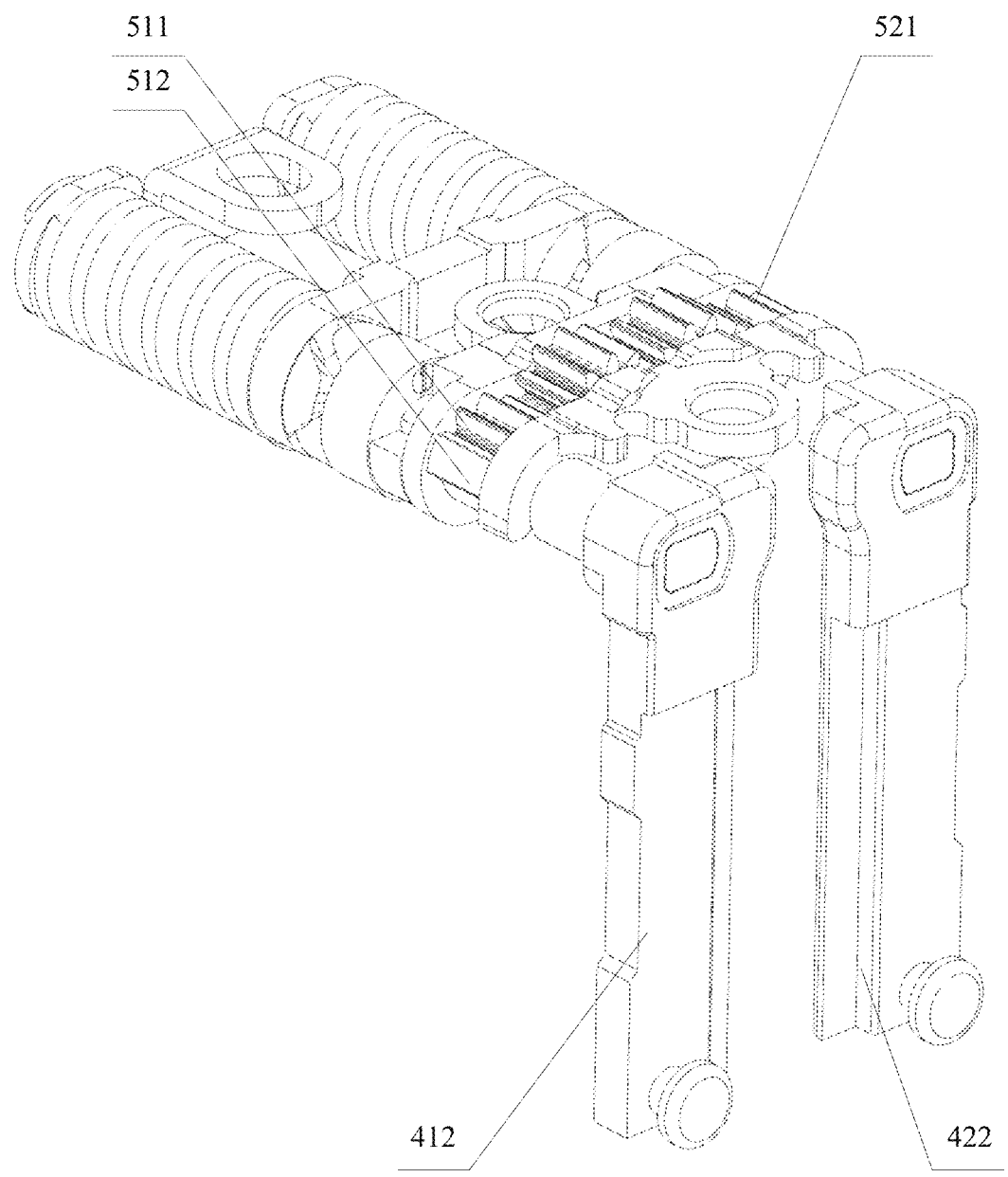
FIG. 11 illustrates a schematic structural diagram of a first torsion structure according to some embodiments of the present disclosure.
Figure 12:
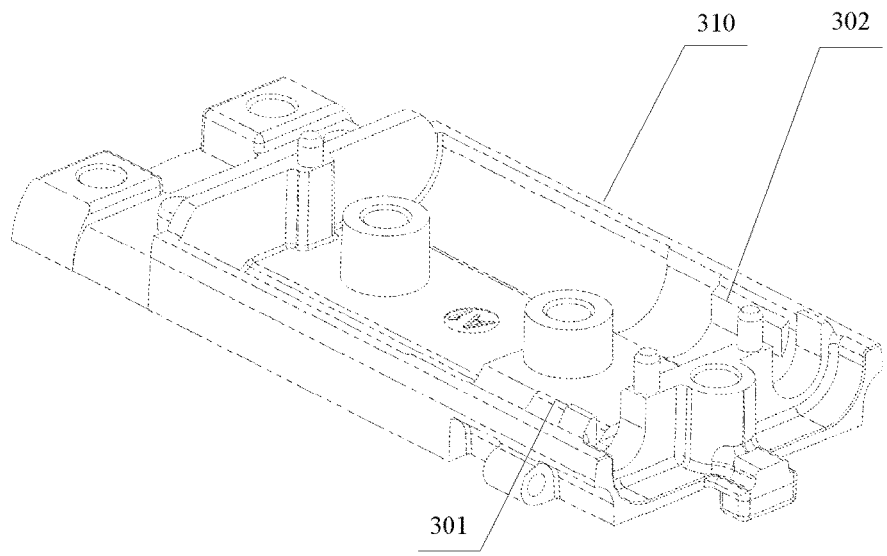
FIG. 12 illustrates a schematic structural diagram of a first center plate segment according to some embodiments of the present disclosure.

As shown in FIG. 9, to facilitate assembly and optimize the layout, the middle plate 300 includes a first middle plate segment 310, a second middle plate segment 320, and a third middle plate segment 330. The first middle plate segment 310 and the second middle plate segment 320 can be connected to the third middle plate segment 330 through connection screws 340. The connection member such as the flexible printed circuit board can be located between the third middle plate segment 330 and the housing of the electronic apparatus. The first torsion structure can be located on an side of the first middle plate segment 310 (a side facing away from the folding screen), and the second torsion structure can be located on an side of the second middle plate segment 320 (a side facing away from the folding screen).

The first end and the second end of the plate assembly can be two ends of the plate assembly, respectively. An arrangement direction of the first end and the second end of the plate assembly can be perpendicular to an arrangement direction of the first plate 100, the second plate 200, and the middle plate 300. The first movement structure can include a first member. The first member can include a first connector 411, a first connection arm 412, a first connection rod 413, and a first movement track 414. The first connector 411 can be configured to be fixedly connected to the first body of the electronic apparatus. The first connection arm 412 can be a connection arm fixedly connected to a first main shaft 511 of the first torsion structure. The first connector 411 can be slidingly connected to the first connection arm 412. A first end of the first connection rod 413 can be rotatably connected to the body housing of the rotation connection mechanism through a first shaft core (not shown). A second end of the first connection rod 413 can be connected to the first connector 411 through the second shaft core 416. The first movement track 414 and the first connector 411 can be fixed. The first movement track 414 can be configured to control the switching of the first plate 100 between the first relative position and the second relative position.

Figure 7:
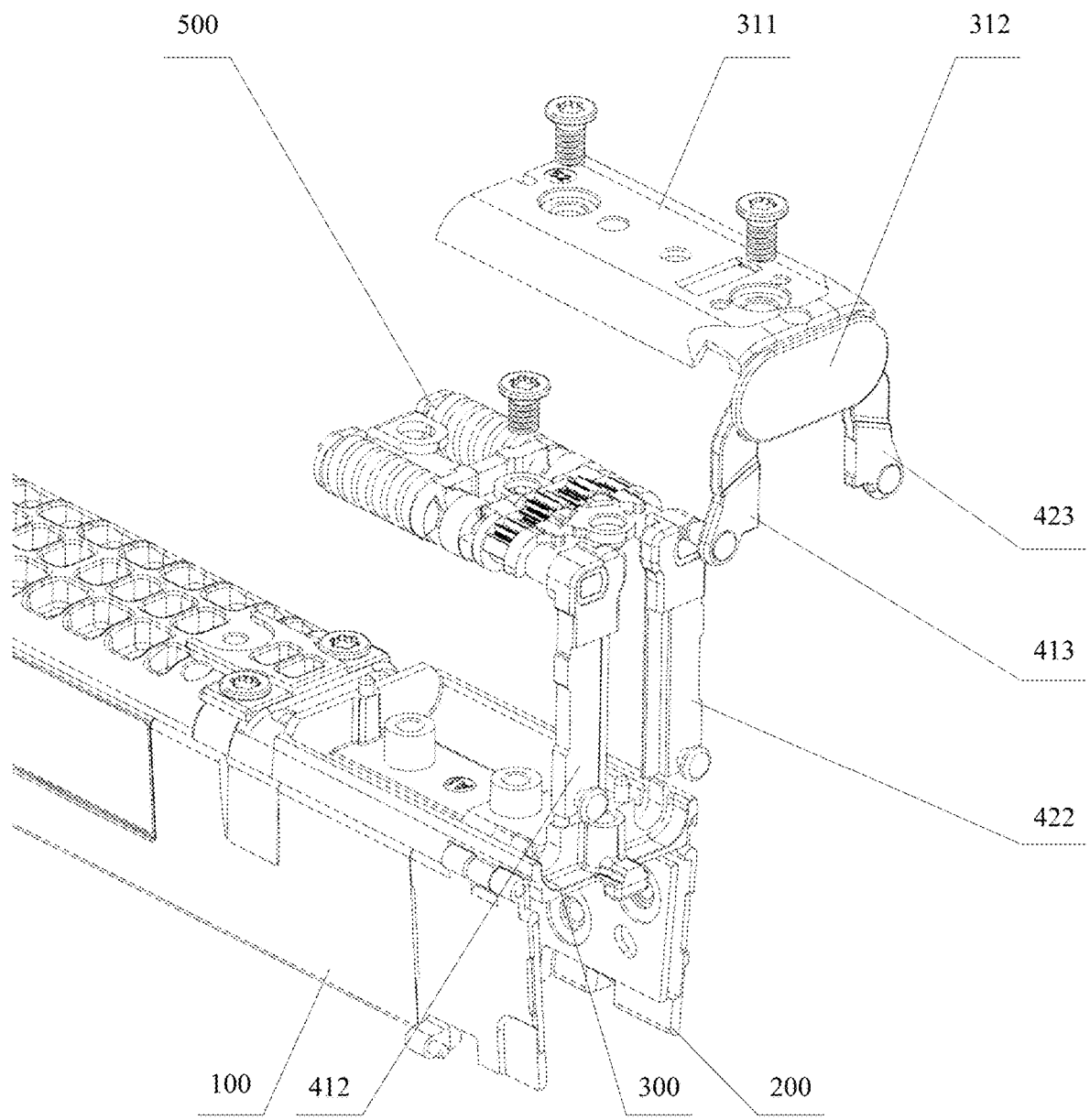
FIG. 7 illustrates a schematic exploded structural diagram of a rotation connection structure according to some embodiments of the present disclosure.

As shown in FIG. 7, the body housing of the rotation connection mechanism includes a torsion housing covering the outside of the torsion structure assembly. Taking the first torsion structure as an example, the first torsion structure 500 is covered with a first torsion housing 311. An end of the first torsion housing 311 includes a first vertical end plate 312. The first connection rod 413 and a second connection rod 423 can be rotatably connected to the first vertical end plate 312.

Figure 8:
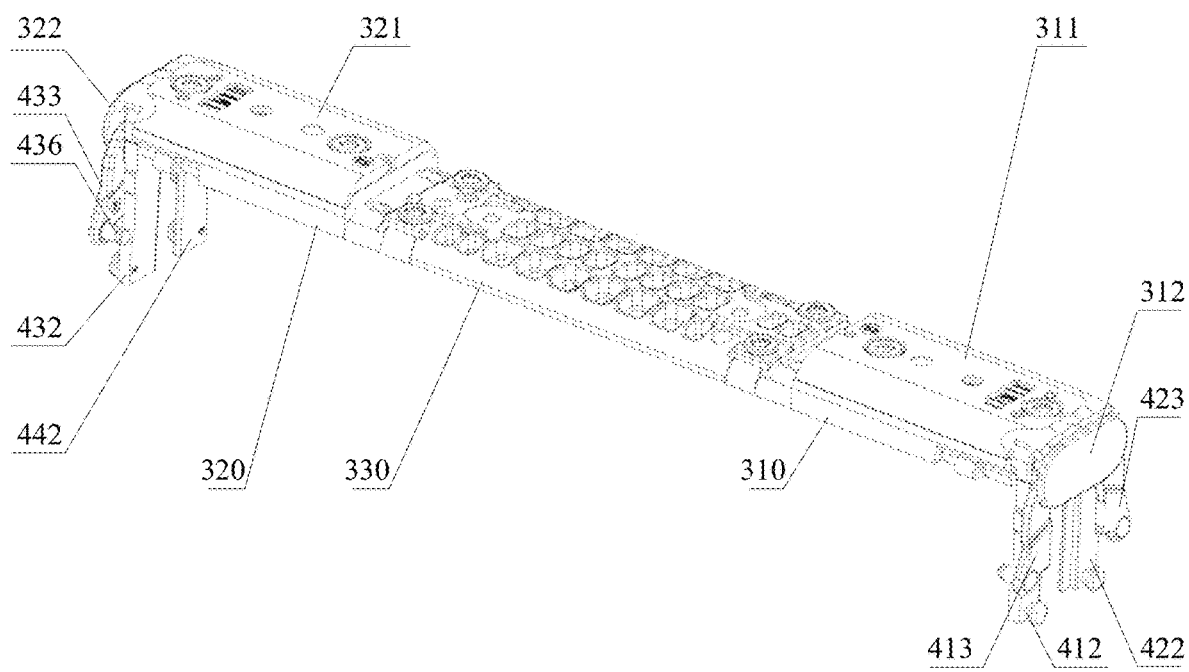
FIG. 8 illustrates a schematic structural diagram showing a rotation connection structure without a plate assembly according to some embodiments of the present disclosure.

As shown in FIG. 8, the second torsion structure is covered with a second torsion housing 321. An end of the second torsion housing 321 includes a second vertical end plate 322. A third connection rod 433 and a fourth connection rod can be rotatably connected to the second vertical end plate 322.

A first end of the first connection rod 413 can be rotatably connected to the body housing of the rotation connection mechanism through the first shaft core (not shown). The first end and the body house can have a pure rotatable connection without relative torsion. Similarly, a second end of the first connection rod 413 can be rotatably connected to the first connector 411 through a second shaft core 416. The second end and the first connector can have a pure connection without relative torsion.

Figure 3:
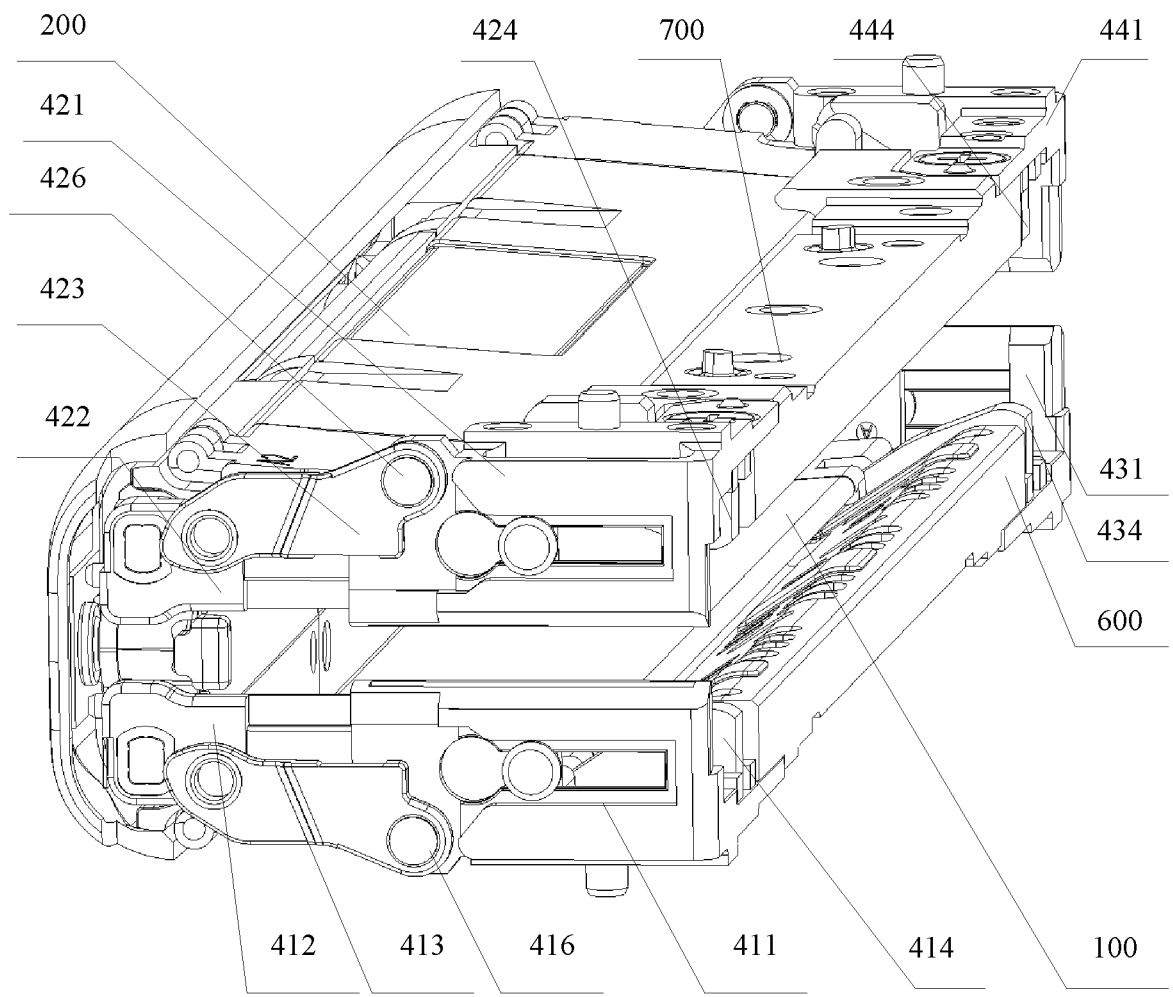
FIG. 3 illustrates a schematic structural diagram of a rotatable connection structure at a second posture according to some embodiments of the present disclosure.
Figure 4:
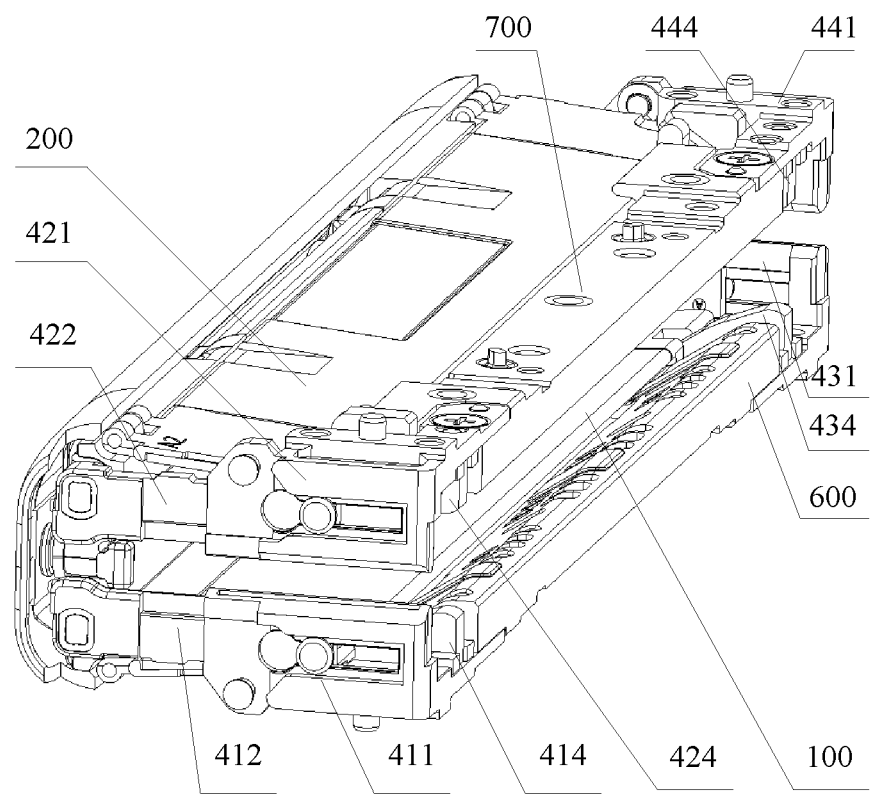
FIG. 4 illustrates a schematic structural diagram of a rotation connection structure without a first connection shaft and a second connection shaft at a second posture according to some embodiments of the present disclosure.
Figure 5:
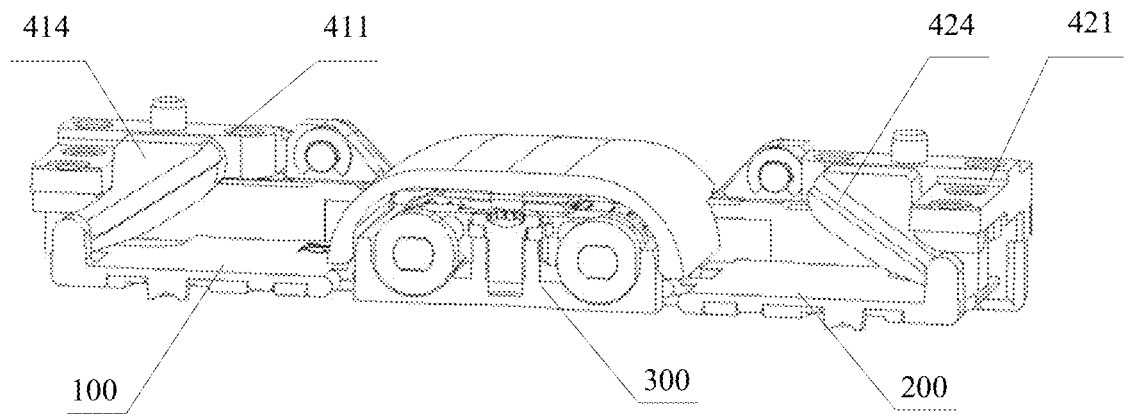
FIG. 5 illustrates a schematic cross-sectional structural diagram showing a first posture of a rotation connection structure according to some embodiments of the present disclosure.
Figure 6:
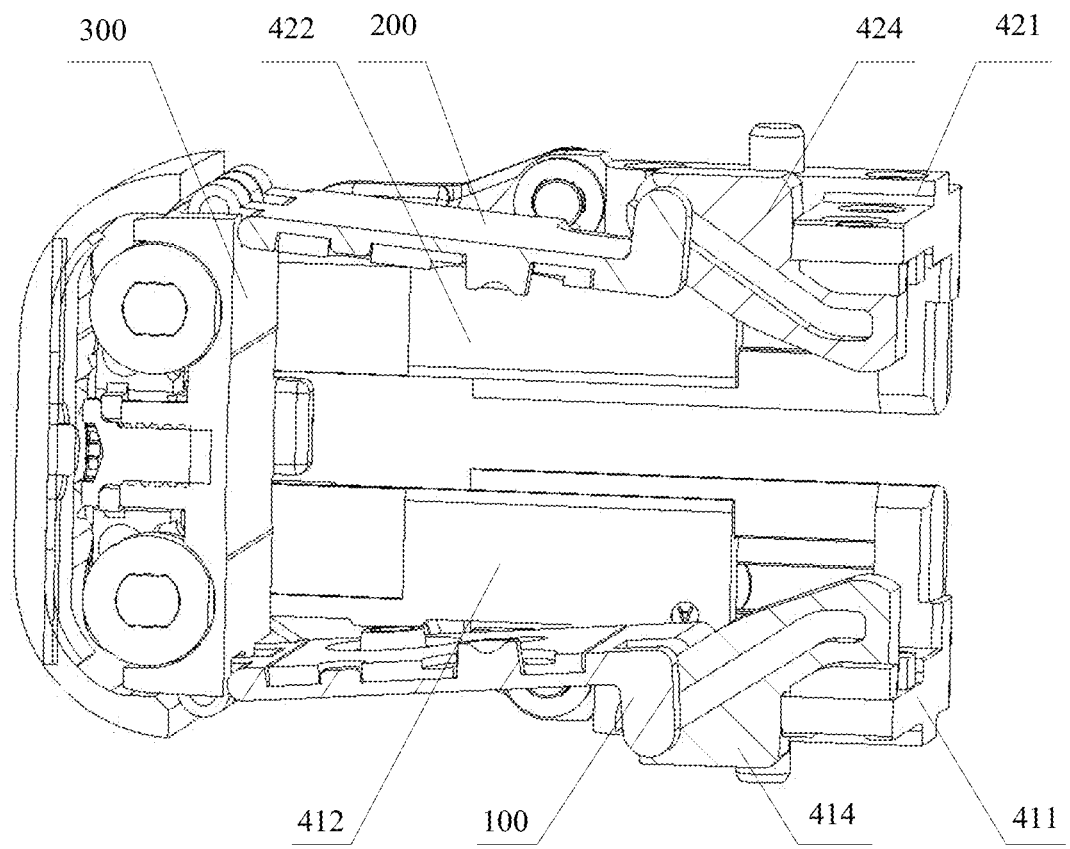
FIG. 6 illustrates a schematic cross-sectional structural diagram showing a second posture of a rotation connection structure according to some embodiments of the present disclosure.

Taking the first member of the first movement structure as an example, as shown in FIG. 1 and FIG. 3, during switching from the first relative position to the second relative position, under the external force, the first connector 411 fixedly connected to the first body of the electronic apparatus can drive the first connection arm 412 to rotate. The first end of the first connection rod 413 can rotate relative to the body housing of the rotation connection mechanism through the first shaft core (not shown). The second end of the first connection rod 413 can rotate relative to the first connector 411 through the second shaft core 416. The first connector 411 can slide relative to the first connection arm 412. The first movement track 414 can be fixed to the first connector 411. The first movement track 414 can be configured to control the switching of the first plate 100 between the first relative position and the second relative position. That is, a combination of rotation and sliding of members of the first member, relative interference among the members of the first member can be avoided. The first movement track 414 can drive the first plate 100 to rotate relative to the middle plate 300 to realize the switching of the first plate 100 from the first relative position to the second relative position.

When the first plate 100 is switched from the first relative position to the second relative position, the second plate 200 can synchronously rotate relative to the middle plate 300 under the action of the torsion structure assembly. That is, when the first plate 100 is switched from the first relative position to the second relative position, the second plate 300 can be switched synchronously from the first relative position to the second relative position.

The first movement track 414 can include an inclined slide track. A side of the first plate 100 can be rotatably connected to the middle plate 300. The other side of the first plate 100 can be slidingly fitted with the inclined slide track. With the movement in connection with the first movement track 414, the switching of the first plate 100 between the first relative position and the second relative position can be realized.

Further, the first movement structure can include a second member. The second member can be mirrored with the first member and include a second connector 421, a second connection arm 422, a second connection rod 423, and a second movement track 424. That is, the first connector 411 and the second connector 421 can be mirrored and configured to be fixedly connected to the first body of the electronic apparatus. The second connection arm 422 and the first connection arm 412 can be mirrored. The second connection arm 422 can be a connection arm fixedly connected to a second main shaft 521 of the first torsion structure. The second connector 421 can be slidingly connected to the second connection arm 422. The first connection rod 413 and the second connection rod 423 can be mirrored. A first end of the second connection rod 423 can be rotatably connected to the body housing of the rotation connection mechanism through a third shaft core. A second end of the second connection rod 423 can be rotatably connected to the second connector 421 through a fourth shaft core 426. The second movement track 424 and the first movement track 414 can be mirrored. The second movement track 424 can be fixed to the second connector 421. The second movement track 421 can be configured to control the switching of the second plate 200 between the first relative position and the second relative position. The first connector 411, the first connection arm 412, the second connector 421, and the second connection arm 422 can form a first set of movement structures of the first movement structure. The first set of movement structures can be configured to transfer the torsion provided by the main shaft (a first main shaft 511 and a second main shaft 521) of the first torsion structure.

The first end of the second connection rod 423 can be rotatably connected to the body housing of the rotation connection mechanism through the third shaft core. The first end and the body housing can have a pure rotatable connection without the torsion. Similarly, a fourth end of the second connection rod 423 can be rotatably connected to the second connector 421 through the fourth shaft core 426. The fourth end and the second connector 421 can have a pure rotatable connection without torsion.

That is, in the first set of movement structures of the first movement structure, the first connection arm 412 can be fixedly connected to the first main shaft 511 of the first torsion structure, and the second connection arm 422 can be fixedly connected to the second main shaft 521 of the first torsion structure. A gear set can be arranged between the first main shaft 511 and the second main shaft 521 of the first torsion structure. During the rotation of the first main shaft 511, the second main shaft 521 can be driven to rotate oppositely and synchronously to transfer the torsion provided by the main shaft of the first torsion structure. Thus, the torsion support can be provided to the first plate 100 and the second plate 200 at the first relative position and the second relative position.

The first connection rod 413, the first movement track 414, the second connection rod 423, and the second movement track 424 can form a second set of movement structures of the first movement structure. The second set of movement structures can be configured to perform linkage control on the first plate 100 and the second plate 200 to switch between a first relative position and a second relative position.

Since the first connection arm 412 and the second connection arm 422 rotate oppositely and synchronously through the first main shaft 511, the first connector 411 can be fixedly connected to the first movement track 414, and the second connector 421 can be fixedly connected to the second movement track 424. Thus, during the rotation of the first connection arm 412 and the second connection arm 422, the first connector 411 can drive the first movement track 414 to rotate around the shaft of the first connection arm 412 and slide along an extension direction of the first connection arm 412 (a direction from an end of the first connection arm 412 to another end). That is, in a process of switching from the first relative position to the second relative position, the first movement track 414 can rotate and slide. Similarly, the second movement track 424 can move synchronously (rotate and slide). Thus, the first plate 100 and the second plate 200 can be switched between the first relative position and the second relative position.

A center line of the above mirrored arrangement can be a plane where a center line of the middle plate 300 is located. The first plate 100 and the second plate 200 can be arranged symmetrically to this plane. The first end of the second connection rod 423 can be rotatably connected to the body housing of the rotation connection mechanism through the third shaft core. The first end and the body housing can have the pure rotatable connection without torsion. Similarly, the fourth end of the second connection rod 423 can be rotatably connected to the second connector 421. The fourth end and the second connector 421 can have the pure rotatable connection without torsion.

Through a combination of rotation and sliding of the members of the second member, the relative interference among the members of the second member can be avoided. The second movement track 424 can drive the second plate 200 to rotate relative to the middle plate 300, which realizes the switching of the second plate 200 from the first relative position to the second relative position.

Similarly, the second movement structure can be arranged symmetrically with the first movement structure. Since the first movement structure is located at a first end of the plate assembly, and the second movement structure is located at the second end of the plate assembly, the second movement structure can move synchronously with the first movement structure to improve the movement stability of the first plate 100 and the second plate of the plate assembly.

That is, the second movement structure can include a third member and a fourth member. The third member and the fourth member can be mirrored. Similarly, a center line of the mirrored arrangement can be a plane where the center line of the middle plate 300 is located. The first plate 100 and the second plate 200 can be arranged symmetrically to the plane.

In some embodiments, the third member can include a third connector 431, a third connection arm 432, a third connection rod 433, and a third movement track 434. The third connector 431 can drive the third connection arm 432 to rotate. A first end of the third connection rod 433 can rotate relative to the body housing of the rotation connection mechanism through a fifth shaft core (not shown). A second end of the third connection rod 433 can rotate relative to the third connector 431 through a sixth shaft core 436. The third connector 431 can slide relative to the third connection arm 432. The third movement track 434 can be fixed to the third connector 431. The third movement track 434 can be configured to control the switching of the first plate 100 between the first relative position and the second relative position. That is, the first member and the third member can be at two ends of the first plate 100. The first member and the third member can move synchronously. Thus, the first member and the third member can move synchronously when the first plate 100 is switched between the first relative position and the second relative position.

In some embodiments, the fourth member can include a fourth connector 441, a fourth connection arm 442, a fourth connection rod (not shown), and a fourth movement track 444. The fourth connector 441 can drive the fourth connection arm 442 to rotate. A first end of the fourth connection rod (not shown) can rotate relative to the body housing of the rotation connection mechanism through a seventh shaft core (not shown). A second end of the fourth connection rod can rotate relative to the fourth connector 441 through an eighth shaft core. The fourth connector 441 can slide relative to the fourth connection arm 442. The fourth movement track 444 can be fixed to the fourth connector 441. The fourth movement track 444 can be configured to control the switching of the second plate 200 between the first relative position and the second relative position. That is, the second member and the fourth member can be located at both ends of the second plate 200, respectively. The second member and the fourth member can move synchronously. Thus, the second member and the fourth member can move synchronously when the second plate 200 is switched between the first relative position and the second relative position.

Similarly, the second movement track 424, the third movement track 434, and the fourth movement track 444 can all include inclined slide tracks.

One side of the first plate 100 can be rotatably connected to the middle plate 300, and two ends of the other side of the first plate 100 can cooperate with an inclined slide track of the first movement track 414 and an inclined slide track of the third movement track 434, respectively. In connection with the movement of the first movement track 414 and the third movement track 434, the first plate 100 can be switched between the first relative position and the second relative position.

One side of the second plate 200 can be rotatably connected to the middle plate 300, and two ends of the other side of the second plate 200 can cooperate with an inclined slide track of the second movement track 424 and an inclined slide track of the fourth movement track 444. In connection with the movement of the second movement track 424 and the fourth movement track 444, the second plate 200 can be switched between the first relative position and the second relative position.

To improve the overall strength of the rotation connection mechanism, a first connection edge member 600 can be arranged between the first movement track 414 and the third movement track 434. Similarly, a second connection edge member 700 can be arranged between the second movement track 424 and the fourth movement track 444.

To avoid damage to the screen caused by hard compressing the screen, a relative moving rate of the body of the electronic apparatus (the first body and the second body) may need to be different from a bending rate of the screen.

Taking the first member as an example, since the first connector 411 is fixedly connected to the first body of the electronic apparatus, the first connection arm 412 can be fixed to the first main shaft 511 and rotate around an axis of the first main shaft 511. Therefore, a rotation rate of the first main shaft 511 can be a rotation rate of the body of the electronic apparatus (the first body and the second body).

Since the axis of the first main shaft 511, an axis of the first shaft core, and an axis of the second core 416 are not collinear, when the first connection arm 412 rotates around the axis of the first main shaft 511, the first connection arm 412 can slide relative to the first connector 411. A position relationship of the axis of the first main shaft 511 relative to the second shaft core 416 can change. The other side of the first plate 100 can slide along the inclined slide track of the first movement track 414. Thus, the rotation rate of the first plate 100 relative to the middle plate 300 can be different from the rotation rate of the first connection arm 412. Therefore, a bending rate of the folding screen guided by the first plate 100 can be different from the bending rate of the body of the electronic apparatus (the first body and the second body). Through a rate difference between the bending rates, the damage to the screen caused by the body of the electronic apparatus hard compressing the screen can be avoided.

In some embodiments, the second torsion structure can include the third main shaft and the fourth main shaft. The third connection arm 432 can be fixedly connected to the third main shaft. The fourth connection arm 442 can be fixedly connected to the fourth main shaft of the second torsion structure. A transmission member (e.g., a gear shaft or gear) can be arranged between the third main shaft and the fourth main shaft of the second torsion structure. The axis of the third main shaft, an axis of the fifth shaft core, and an axis of the sixth shaft core cannot be collinear. A shaft assembly including the first main shaft 511, the first shaft core, and the second shaft core 416 and a shaft assembly including the third main shaft, the fifth shaft core, and the sixth shaft core 436 can be arranged at two ends of the first plate 100, respectively. Thus, the rotation rate of the first plate 100 can be different from the rotation rate of the first body of the electronic apparatus.

Similarly, the axis of the second main shaft 521, the axis of the third shaft core, and the axis of the fourth shaft core 426 cannot be collinear. The axis of the fourth main shaft, the axis of the seventh shaft core, and the axis of the eighth shaft core cannot be collinear. Through the above arrangement, the rotation rate of the second plate 200 and the rotation rate of the second body of the electronic apparatus can be different.

In some embodiments, when the first plate 100 and the second plate 200 are in the first relative position, the axis of the first main shaft 511, the axis of the first shaft core, and the axis of the second shaft core 416 can form a first triangle. When the first plate 100 and the second plate 200 are in the second relative position, the axis of the first main shaft 511, the axis of the first shaft core, and the axis of the second shaft core 416 can form a second triangle. When the first plate 100 and the second plate 200 are switched between the first relative position and the second relative position, movement of a mating surface of the first plate 100 and movement of a mating surface of the second plate 200 can be prevented from compressing the flexible bending part of the flexible display touchscreen of the electronic apparatus.

In some embodiments, a distance between the axis of the first main shaft 511 and the axis of the first shaft core can remain unchanged, and a distance between the axis of the first shaft core and the axis of the second shaft core 416 can remain unchanged. During the process of switching between the first relative position and the second relative position, a distance between the axis of the first main shaft 511 and the axis of the second shaft core 416 can be changed. A largest angle of the first triangle can be smaller than a largest angle of the second triangle. Therefore, the second triangle can be an overall flat triangle.

According to the above arrangement, the rotation rate of the first main shaft 511 can be smaller than the rotation rate of the first plate 100 relative to the middle plate 300. When a rotation angle of the first main shaft 511 is 90°, a rotation angle of the first plate 100 relative to the middle plate 300 can be greater than 90°. Thus, the first plate 100 and the second plate 200 can get close to each other in a direction away from the middle plate 300 to avoid compressing the flexible bending part of the flexible display touchscreen of the electronic apparatus.

The mating surface of the first plate can be a surface in contact with the folding screen (flexible display touchscreen). The mating surface of the second plate can be a surface in contact with the folding screen (flexible display touchscreen).

The first main shaft 511 cannot be coaxial with a first connection shaft 601 of the first plate 100 that rotates relative to the middle plate 300. The overall thickness (the thickness after being folded) of the electronic apparatus may need to be reduced when the first plate 100 and the second plate 200 are at the second relative position, while a middle bending angle (a bending angle of an inner bending area) of the flexible bending part of the folding screen (the flexible display touchscreen) may need to be satisfied to avoid creases due to a too small screen bending angle. Thus, the first connection shaft 601 of the first plate 100 that rotates relative to the middle plate 300 can be arranged on the side of the first main shaft 511. Through the above arrangement, the distance between the first connection shaft 601 of the first plate 100 that rotates relative to the middle plate 300 and a second connection shaft 602 of the second plate 200 that rotates relative to the middle plate 300 can be further increased. Moreover, since the movement structure assembly is arranged at an end of the plate assembly, and the torsion structure assembly is arranged on the back of the plate assembly (away from the folding screen), the middle bending angle can be possibly increased by possibly increasing the distance between the first connection shaft 601 and the second connection shaft 602. The side of the first main shaft 511 can be the side of the first main shaft 511 away from the folding screen.

Similarly, the second connection shaft of the second plate 200 that rotates relative to the middle plate 300 can be arranged on the side of the second main shaft 521. The side of the second main shaft 521 can be the side of the second main shaft 521 away from the folding screen.

For a symmetrical arrangement, the first connection shaft of the first plate 100 that rotates relative to the middle plate 300 can be arranged on the side of the third main shaft. The second connection shaft of the second plate 200 that rotates relative to the middle plate 300 can be arranged on the side of the fourth main shaft. In some embodiments, to cause the flexible bending part of the folding screen (the flexible display touchscreen) to form a water drop-shaped structure after bending, the first connection shaft of the first plate 100 that rotates relative to the middle plate 300 can be arranged at a first edge of the middle plate 300, and the second connection shaft of the second plate 200 that rotates relative to the middle plate 300 can be arranged at a second edge of the middle plate 300. The first movement track 414 can cooperate with a far end of the first plate 100 corresponding to the first connection shaft. The second movement track 424 can cooperate with a far end of the second plate 200 corresponding to the second connection shaft. When the first plate 100 and the second plate 200 are at the second relative position, a distance between the far end of the first plate 100 and the far end of the second plate 200 can be closer. That is, when the first plate 100 and the second plate 200 are at the second relative position, a distance between the first edge and the second edge of the middle plate 300 can be greater than the distance between the far end of the first plate 100 and the far end of the second plate 200. The distance between the first edge and the second edge of the middle plate 300 can be a distance between the first connection end of the first plate 100 that is rotatably connected to the middle plate 300 and the second connection end of the second plate 200 that is rotatably connected to the middle plate 300.

In some embodiments, the electronic apparatus can be in a closed state (the first plate 100 and the second plate 200 are at the second relative position). The first part and the second part of the folding screen can be connected to the first body and the second body of the electronic apparatus, respectively. Since the distance between the far end of the first plate 100 and the far end of the second plate 200 is closer, the first part and the second part of the folding screen can be close to each other, which effectively reduces the gap of the electronic apparatus in the closed state (the gap between the first part and the second part of the folding screen).

The flexible bending part (third part) of the folding screen can be arranged between the first part and the second part.

As shown in FIG. 11 to FIG. 16, the first torsion structure includes the first main shaft 511, the gear assembly, and the second main shaft 521. The first main shaft 511 includes a first special-shaped gear. The second main shaft 521 includes a second special-shaped gear. The first torsion structure can rotate synchronously through the cooperation of the gear assembly with the first special-shaped gear and the second special-shaped gear. Through the first special-shaped gear with a first set of position-limiting points 301 and the second special-shaped gear with a second set of position-limiting points 302, the first torsion structure can have a first opening and closing angle of the electronic apparatus corresponding to the first relative position and a second opening and closing angle of the electronic apparatus corresponding to the second relative position.

In some embodiments, the first special-shaped gear includes a first position-limiting member 513 and a second position-limiting member 512. The second special-shaped gear includes a third position-limiting member 523 and a fourth position-limiting member 522.

Figure 13:
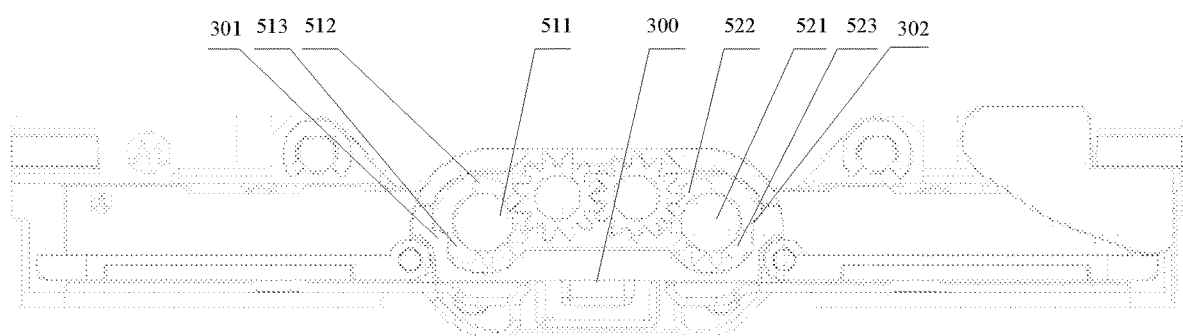
FIG. 13 illustrates a schematic structural diagram showing a first posture of a torsion structure set according to some embodiments of the present disclosure.
Figure 14:
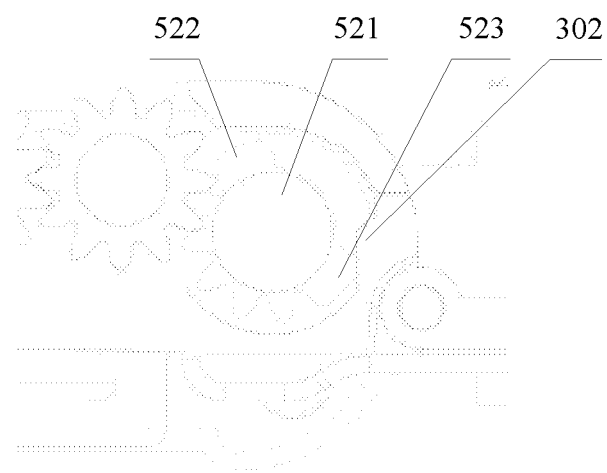
FIG. 14 illustrates a schematic local enlarged diagram showing a first posture of a torsion structure set according to some embodiments of the present disclosure.

As shown in FIG. 13 and FIG. 14, the first plate 100 and the second plate 200 are in the first relative position. The first position-limiting member 513 of the first special-shaped gear can be position-limited by and in contact with a side of the first set of position-limiting points 301. The third position-limiting member 523 of the second special-shaped gear can be position-limited by and in contact with a side of the first set of position-limiting points 301. Thus, the first plate 100 and the second plate 200 can rotate relative to the middle plate 300 to cause the first plate 100, the middle plate 300, and the second plate 200 to form a plane. Therefore, the first relative position can correspond to the first opening and closing angle of the electronic apparatus. The first opening and closing angle can include 180°.

Figure 15:
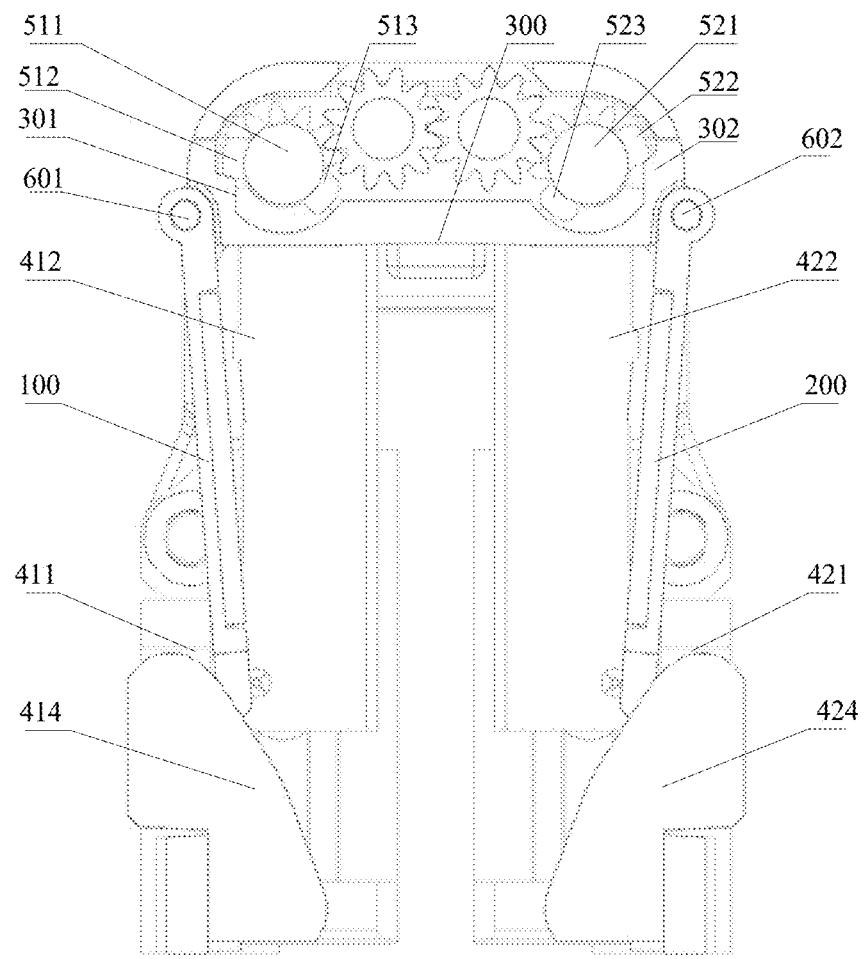
FIG. 15 illustrates a schematic structural diagram showing a second posture of a torsion structure set according to some embodiments of the present disclosure.
Figure 16:
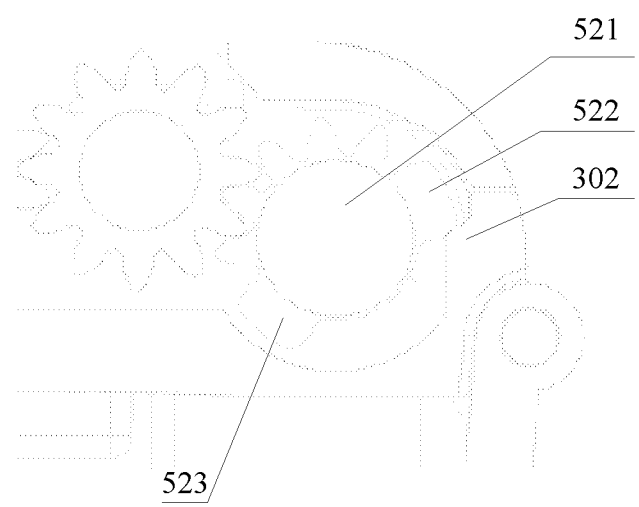
FIG. 16 illustrates a schematic local enlarged diagram showing a second posture of a torsion structure set according to some embodiments of the present disclosure.

As shown in FIG. 15 and FIG. 16, the first plate 100 and the second plate 200 are in the second relative position. The second position-limiting member 512 of the first special-shaped gear can be position limited by and in contact with the other side of the first set of position-limiting points 301. The fourth position-limiting member 522 of the second special-shaped gear can be position limited by and in contact with the other side of the first set of position-limiting points 301. Thus, the first plate 100 and the second plate 200 can rotate relative to the middle plate 300 to cause the first plate 100 and the second plate 200 to face each other and have a target angle. Therefore, the second relative position can correspond to the second opening and closing angle of the electronic apparatus. The second opening and closing angle can include 0°.

Thus, the first special-shaped gear and the first set of position-limiting points and the second special-shaped gear and the second set of position-limiting points can limit the position of the first opening and closing angle and the second opening and closing angle of the electronic apparatus, respectively. That is, through the position-limiting of the first special-shaped gear and the first set of position-limiting points, the first opening and closing angle of the electronic apparatus can be realized. Since the synchronous rotation is realized through the cooperation of the gear assembly with the first special-shaped gear and the second special-shaped gear, the second special-shaped gear can also limit the position. Moreover, through the position-limiting of the second special-shaped gear and the second set of position-limiting points, the second opening and closing angle of the electronic apparatus can be realized. Since the synchronous rotation is realized through the cooperation of the gear assembly with the first special-shaped gear and the second special-shaped gear, the first special-shaped gear can also limit the position.

The present disclosure also provides an electronic apparatus. The electronic apparatus can include the first body, the second body, the rotation connection mechanism, and the flexible display touchscreen. The first body can be movably connected to the second body through the rotation connection mechanism. The first part of the flexible display touchscreen can be fixed on a first surface of the first body. The second part of the flexible display touchscreen can be fixed on a second surface of the second body. The third part of the flexible display touchscreen can be arranged between the first part and the second part. The third part of the flexible display touchscreen can be the flexible bending part. The movement structure assembly of the rotation connection mechanism can be located outside the coverage area of the flexible display touchscreen. Through the above arrangement, the interference between the movement structure assembly and the flexible display touchscreen can be avoided, and an accommodation space of the third part of the flexible display touchscreen after being bent can be enlarged.

The first body can be in the first posture with the second body through the rotation connection mechanism. The first plate 100 of the rotation connection mechanism and the second plate 200 of the rotation connection mechanism can be at the first relative position. The first plate 100, the second plate 200, and the middle plate 300 can form a plane. The plane can be in a same plane with the first surface of the first body and the second surface of the second body.

The first body can be in the second posture with the second body through the rotation connection mechanism. The first plate 100 of the rotation connection mechanism and the second plate 200 of the rotation connection mechanism can be at the second relative position. The first plate 100 and the second plate can have a target angle.

The first body can be in the first posture with the second body through the rotation connection mechanism. The first plate 100 and the second plate 200 are at the first relative position, the first plate 100, the middle plate 300, and the second plate 200 can form the plane. The plane can be in the same plane as the first surface of the first body and the second surface of the second body. Thus, in the first posture, the first body, the rotation connection mechanism, and the surface of the second body can be in the same plane, which can better support the members (e.g., the flexible display touchscreen) on the first body, the rotation connection mechanism, and the surface of the second body.

The first body can be in the second posture with the second body through the rotation connection mechanism. The first plate 100 and the second plate 200 can be at the second relative position. The first plate 100 can face the second plate 200 and have the target angle. Thus, the first plate 100, the middle plate 300, and the second plate 200 can guide the bending of the folding screen (e.g., the flexible display touchscreen) arranged therebetween. The torsion support provided by the torsion structure assembly at the second relative position, the stability of the first plate 100 and the second plate 200 can be ensured at the second relative position. Thus, the predetermined target screen bending angle can be ensured to be realized for the folding screen (e.g., the flexible display touchscreen). When the first plate 100 and the second plate 200 are switched from the second relative position to the first relative position, the operator or the apparatus can provide the external force. Thus, under external force, the torsion structure assembly can provide the force for the movement structure assembly to control the first plate 100 and the second plate 200.

Thus, while facilitating the bending of the folding screen (e.g., the flexible display touchscreen), the probability of the creases occurring on the folding screen can be reduced, which ensures the application performance of the folding screen.

The folding screen can also be another type of screen, such as a non-touchscreen.

The first part of the flexible display touchscreen can be fixed on the first surface of the first body. The second part of the flexible display touchscreen can be fixed on the second surface of the second body. The third part of the flexible display touchscreen can be arranged between the first part and the second part. The third part of the flexible display touchscreen can be the flexible bending part.

In some embodiments, the entire flexible display touchscreen can be set as a flexibly bending area, or only the third part can be set as the flexibly bending area.

The first part of the flexible display touchscreen can be fixed on the first surface of the first body. The first connector can be fixedly connected with the first body of the electronic apparatus. Therefore, the position of the first connector 411 relative to the first part of the flexible display touchscreen can remain unchanged. Similarly, the position of the second connector 421 relative to the second part of the flexible display touchscreen can remain unchanged. The flexible bending requirement of the third part can be satisfied through the movement structure assembly.

The first body can be in the first posture with the second body through the rotation connection mechanism. The first plate and the second plate can be at the first relative position and provide a flat support for the third part. Thus, the third part of the flexible display touchscreen, the first part, and the second part can be coplanar.

The first body can be in the second posture with the second body through the rotation connection mechanism. The first plate and the second plate can be at the second relative position, and the rotation connection mechanism can provide the accommodation space to accommodate the third part of the flexible display touchscreen. The first plate 100 and the first surface can have a predetermined angle to cause the third part of the flexible display touchscreen to form a second outer bending area. The second plate 200 and the second surface can have a predetermined angle to cause the third part of the flexible display touchscreen to form a second outer bending area. An area other than the first outer bending area and the second outer bending area of the third part of the flexible display touchscreen can be an inner bending area.

The first plate 100 and the second plate 200 can be at the second relative position. The first plate 100, the middle plate 300, and the second plate 200 can form a space to accommodate the third part of the flexible display touchscreen. The third part accommodated in the space can be in a bent state, i.e., can include the first outer bending area, the second outer bending area, and the inner bending area.

Embodiments of the present disclosure are described in a progressive manner, each embodiment focuses on the difference from other embodiments, and the same and similar parts of embodiments can be referred to each other.

The above description of embodiments of the present disclosure is provided to enable those skilled in the art to make or use the present disclosure. Various modifications to embodiments of the present disclosure are apparent to those skilled in the art. The modifications are within the scope of the present disclosure. The general principles defined here can be implemented in other embodiments without departing from the spirit or scope of the present disclosure. Therefore, the present disclosure is not limited to embodiments of the present disclosure but conforms to the widest scope consistent with the principles and novel features disclosed here.

What is claimed is:

1. A rotation connection mechanism, comprising:
   a plate assembly including:
      a middle plate;
      a first plate being rotatably connected to the middle plate; and
      a second plate being rotatably connected to the middle plate;
   a movement structure assembly including:
      a first movement structure arranged at a first end of the plate assembly, and including:
         a first set of movement structures; and
         a second set of movement structures including a first movement track and a second movement track, the first plate being slidingly fitted with the first movement track, and the second plate being slidingly fitted with the second movement track; and
      a second movement structure arranged symmetrically with the first movement structure and arranged at a second end of the plate assembly; and
   a torsion structure assembly arranged on a side of the middle plate and including:
      a first torsion structure cooperating with the first movement structure; and
      a second torsion structure cooperating with the second movement structure;
   wherein:
      the movement structure assembly is configured to control the first plate and the second plate to be at a first relative position, and the first plate, the middle plate, and the second plate form a plane;
      the movement structure assembly is configured to control the first plate and the second plate to be at a second relative position, and the first plate and the second plate face each other and have a target angle;
      the torsion structure assembly provides torsion support at the first relative position and the second relative position through the movement structure assembly;
      the torsion structure assembly provides a force for switching the first plate and the second plate between the first relative position and the second relative position through the movement structure;
      the first set of movement structures is configured to transfer torsion provided by a main shaft of the first torsion structure; and
      the second set of movement structures is configured to linkage-control the first plate and the second plate to switch between the first relative position and the second relative position.

2. The rotation connection mechanism according to claim 1, wherein the first movement structure includes a first member including:
   a first connector configured to be fixedly connected to a first body of an electronic apparatus;
   a first connection arm being a connection arm fixedly connected to a first the main shaft of the first torsion structure, the first connector being slidably connected to the first connection arm;
   a first connection rod, a first end of the first connection rod being rotatably connected to a body housing of the rotation connection mechanism through a first shaft core, and a second end of the first connection rod being rotatably connected to the first connector through a second shaft core; and
   the first movement track, the first movement track being fixed to the first connector.

3. The rotation connection mechanism according to claim 2, wherein the first movement structure includes a second member mirrored with the first member and including:
   a second connector be fixedly connected to a second body of an electronic apparatus;
   a second connection arm;
   a second connection rod; and
   the second movement track;
   wherein:
      the first connector, the first connection arm, the second connector, and the second connection arm form the first set of movement structures of the first movement structure; and
      the first connection rod, the first movement track, the second connection rod, and the second movement track form the second set of movement structures of the first movement structure.

4. The rotational connection mechanism according to claim 3, wherein an axis of the main shaft, an axis of the first shaft core, and an axis of the second shaft core are not collinear.

5. The rotation connection mechanism according to claim 4, wherein:
   the first plate and the second plate are at the first relative position, and the axis of the main shaft, the axis of the first shaft core, and the axis of the second shaft core form a first triangle;
   the first plate and the second plate are at the second relative position, and the axis of the main shaft, the axis of the first shaft core, and the axis of the second shaft core form a second triangle; and
   during a switching of the first plate and the second plate between the first relative position and the second relative position, a flexible bending part of a flexible display touchscreen of the electronic apparatus compressed by movement of a mating surface of the first plate and movement of a mating surface of the second plate is avoided.

6. The rotation connection mechanism according to claim 5, wherein a first connection shaft of the first plate that rotates relative to the middle plate is arranged on a side of the main shaft.

7. The rotation connection mechanism according to claim 1, wherein:
- a first connection shaft of the first plate that rotates relative to the middle plate is arranged at a first edge of the middle plate, and a second connection shaft of the second plate that rotates relative to the middle plate is arranged at a second edge of the middle plate;
- the first movement track cooperates with a far end of the first plate corresponding to the first connection shaft;
- the second movement track cooperates with a far end of the second plate corresponding to the second connection shaft; and
- the first plate and the second plate are at the second relative position, and the far end of the first plate is close to the far end of the second plate.

8. The rotation connection mechanism according to claim 1, wherein the main shaft of the first torsion structure includes:
- a first main shaft including a first special-shaped gear; and
- a second main shaft including a second special-shaped gear;

wherein:
- the first torsion structure realizes a synchronous rotation through cooperation of a gear assembly with the first special-shaped gear and the second special-shaped gear; and
- the first torsion structure realizes a first opening and closing angle of an electronic apparatus corresponding to the first relative position and a second opening and closing angle of the electronic apparatus corresponding to the second relative position through the first special-shaped gear with a first set of position-limiting points and the second special-shaped gear with a second set of position-limiting points.

9. An electronic apparatus comprising:
- a first body;
- a second body;
- a rotation connection mechanism, the first body being movably connected to the second body through the rotation connection mechanism, and the rotation connection mechanism including:
  - a plate assembly including:
    - a middle plate;
    - a first plate being rotatably connected to the middle plate; and
    - a second plate being rotatably connected to the middle plate;
  - a movement structure assembly including:
    - a first movement structure arranged at a first end of the plate assembly, and including:
      - a first set of movement structures; and
      - a second set of movement structures including a first movement track and a second movement track, the first plate being slidingly fitted with the first movement track, and the second plate being slidingly fitted with the second movement track; and
    - a second movement structure arranged symmetrically with the first movement structure and arranged at a second end of the plate assembly; and
  - a torsion structure assembly arranged on a side of the middle plate and including:
    - a first torsion structure cooperating with the first movement structure; and
    - a second torsion structure cooperating with the second movement structure; and
- a flexible display touchscreen, a first part of the flexible display touchscreen being fixed on a first surface of the first body, a second part of the flexible display touchscreen being fixed on a second surface of the second body, a third part of the flexible display touchscreen being arranged between the first part and the second part, the third part of the flexible display touchscreen being a flexible bending part, and a movement structure assembly of the rotation connection mechanism being located outside a coverage area of the flexible display touchscreen;

wherein:
- the first body is in a first posture with the second body through the rotation connection mechanism, the first plate of the rotation connection mechanism and the second plate of the rotation connection mechanism are at a first relative position, the first plate, the second plate, and the middle plate form a plane, and the plane is coplanar with the first surface of the first body and the second surface of the second body;
- the first body is in a second posture with the second body through the rotation connection mechanism, the first plate of the rotation connection mechanism and the second plate of the rotation connection mechanism are at a second relative position, and the first plate and the second plate face to each other and have a target angle;
- the torsion structure assembly provides torsion support at a first relative position and the second relative position through the movement structure assembly;
- the torsion structure assembly provides a force for switching the first plate and the second plate between the first relative position and the second relative position through the movement structure;
- the first set of movement structures is configured to transfer torsion provided by a main shaft of the first torsion structure; and
- the second set of movement structures is configured to linkage-control the first plate and the second plate to switch between the first relative position and the second relative position.

10. The electronic apparatus according to claim 9, wherein:
- the first body is in the first posture with the second body through the rotation connection mechanism, and the first plate and the second plate are at the first relative position to provide flat support for the third part to cause the third part of the flexible display screen to be coplanar with the first part and the second part; and
- the first body is in the second posture with the second body through the rotation connection mechanism, the first plate and the second plate are at the second relative position to provide accommodation space at the rotation connection mechanism to accommodate the third part of the flexible display screen, the first plate and the first surface form a predetermined angle to cause the third part of the flexible display to form a first outer bending area, the second plate and the second surface form a predetermined angle to cause the third part of the flexible display screen to form a second outer bending area, and an area of the third part of the flexible display screen except for the first outer bending area and the second outer bending area is an inner bending area.

11. The electronic apparatus according to claim 9, wherein the first movement structure includes a first member including:

a first connector configured to be fixedly connected to a first body of the electronic apparatus;
a first connection arm being a connection arm fixedly connected to the main shaft of the first torsion structure, the first connector being slidably connected to the first connection arm;
a first connection rod, a first end of the first connection rod being rotatably connected to a body housing of the rotation connection mechanism through a first shaft core, and a second end of the first connection rod being rotatably connected to the first connector through a second shaft core; and
the first movement track, the first movement track being fixed to the first connector.

12. The electronic apparatus according to claim 11, wherein the first movement structure includes a second member mirrored with the first member and including:
a second connector;
a second connection arm;
a second connection rod; and
the second movement track;
wherein:
the first connector, the first connection arm, the second connector, and the second connection arm form the first set of movement structures of the first movement structure; and
the first connection rod, the first movement track, the second connection rod, and the second movement track form the second set of movement structures of the first movement structure.

13. The electronic apparatus according to claim 12, wherein an axis of the main shaft, an axis of the first shaft core, and an axis of the second shaft core are not collinear.

14. The electronic apparatus according to claim 13, wherein:
the first plate and the second plate are at the first relative position, and the axis of the main shaft, the axis of the first shaft core, and the axis of the second shaft core form a first triangle;
the first plate and the second plate are at the second relative position, and the axis of the main shaft, the axis of the first shaft core, and the axis of the second shaft core form a second triangle; and
during a switching process of the first plate and the second plate between the first relative position and the second relative position, a flexible bending part of a flexible display touchscreen of the electronic apparatus compressed by movement of a mating surface of the first plate and movement of a mating surface of the second plate can be avoided.

15. The electronic apparatus according to claim 14, wherein a first connection shaft of the first plate that rotates relative to the middle plate is arranged on an side of the main shaft.

16. The electronic apparatus according to claim 9, wherein:
a first connection shaft of the first plate that rotates relative to the middle plate is arranged at a first edge of the middle plate, and a second connection shaft of the second plate that rotates relative to the middle plate is arranged at a second edge of the middle plate;
the first movement track cooperates with a far end of the first plate corresponding to the first connection shaft;
the second movement track cooperates with a far end of the second plate corresponding to the second connection shaft; and the first plate and the second plate are at the second relative position, and the far end of the first plate is close to the far end of the second plate.

17. The electronic apparatus according to claim 9, wherein the main shaft of the first torsion structure includes:
a first main shaft including a first special-shaped gear; and
a second main shaft including a second special-shaped gear;
wherein:
the first torsion structure realizes a synchronous rotation through cooperation of a gear assembly with the first special-shaped gear and the second special-shaped gear; and
the first torsion structure realizes a first opening and closing angle of the electronic apparatus corresponding to the first relative position and a second opening and closing angle of the electronic apparatus corresponding to the second relative position through the first special-shaped gear with a first set of position-limiting points and the second special-shaped gear with a second set of position-limiting points.

18. A rotation connection mechanism, comprising:
a plate assembly including a middle plate, a first plate rotatably connected to the middle plate, and a second plate rotatably connected to the middle plate;
a movement structure assembly including:
a first movement structure arranged at a first end of the plate assembly, and including:
a first member including:
a first connector configured to be fixedly connected to a first body of an electronic apparatus;
a first connection arm being a connection arm fixedly connected to a main shaft of the first torsion structure, the first connector being slidably connected to the first connection arm;
a first connection rod, a first end of the first connection rod being rotatably connected to a body housing of the rotation connection mechanism through a first shaft core, and a second end of the first connection rod being rotatably connected to the first connector through a second shaft core; and
a first movement track being fixed to the first connector, the first movement track being configured to control switching of the first plate between the first relative position and the second relative position; and
a second member mirrored with the first member, and including a second connector be fixedly connected to a second body of an electronic apparatus, a second connection arm, a second connection rod, and a second movement track; and
a second movement structure arranged symmetrically with the first movement structure and arranged at a second end of the plate assembly; and
a torsion structure assembly arranged on a side of the middle plate, and including a first torsion structure cooperating with the first movement structure, and a second torsion structure cooperating with the second movement structure;
wherein:
the movement structure assembly is configured to control the first plate and the second plate to be at a first relative position, and the first plate, the middle plate, and the second plate form a plane;
the movement structure assembly is configured to control the first plate and the second plate to be at a second relative position, and the first plate and the second plate face each other and have a target angle;

the torsion structure assembly provides torsion support at the first relative position and the second relative position through the movement structure assembly;

the torsion structure assembly provides a force for switching the first plate and the second plate between the first relative position and the second relative position through the movement structure;

the first connector, the first connection arm, the second connector, and the second connection arm form a first set of movement structures of the first movement structure, and the first set of movement structures are configured to transfer torsion provided by the main shaft of the first torsion structure; and the first connection rod, the first movement track, the second connection rod, and the second movement track form a second set of movement structures of the first movement structure, and the second set of movement structures is configured to linkage-control the first plate and the second plate to switch between the first relative position and the second relative position.

* * * * *